United States Patent [19]
Fifield et al.

[11] Patent Number: 5,796,270
[45] Date of Patent: Aug. 18, 1998

[54] SELF-TIMED DRIVER CIRCUIT

[75] Inventors: John Atkinson Fifield, Underhill; Glenn Peter Giacalone, Shelburne; Peter Joel Jenkins, S. Burlington, all of Vt.

[73] Assignee: International Business Machines Corporation, Armonk, N.Y.

[21] Appl. No.: 703,172

[22] Filed: Aug. 22, 1996

Related U.S. Application Data

[62] Division of Ser. No. 506,933, Jul. 26, 1995, Pat. No. 5,561,694.

[51] Int. Cl.$^6$ .................................. H03K 19/0175
[52] U.S. Cl. ...................... 326/86; 326/58; 326/98; 326/21
[58] Field of Search ........................ 326/58, 86, 95, 326/98, 21

[56] References Cited

U.S. PATENT DOCUMENTS

| | | |
|---|---|---|
| 4,334,157 | 6/1982 | Ferris . |
| 4,638,187 | 1/1987 | Ferris ........................... 327/208 |
| 4,758,739 | 7/1988 | Ovens et al. . |
| 4,763,023 | 8/1988 | Spence ........................... 326/86 |
| 4,849,658 | 7/1989 | Iwamura et al. . |
| 4,883,989 | 11/1989 | Mizukami ........................ 326/86 |
| 4,985,903 | 1/1991 | Heichler ......................... 375/36 |
| 5,023,838 | 6/1991 | Herbert ......................... 365/189.08 |
| 5,225,723 | 7/1993 | Drako ............................ 326/56 |
| 5,448,181 | 9/1995 | Chiang .......................... 326/58 |
| 5,455,521 | 10/1995 | Dobbeleare ..................... 326/86 |
| 5,561,694 | 10/1996 | Fifield et al. ................... 326/86 |
| 5,684,411 | 11/1997 | Nepple .......................... 326/38 |

*Primary Examiner*—Michael J. Tokar
*Assistant Examiner*—Richard Roseen
*Attorney, Agent, or Firm*—Schmeiser, Olsen & Watts; Eugene I. Shkurko

[57] ABSTRACT

A driver circuit provides for selectively changing the state of an output signal, such as a pre-charged dynamic bus signal. The circuit detects whether or not the data is the opposite state as the pre-charged bus signal, and if so, it drives the bus to the appropriate state. The output from the circuit is self-timed when data can be driven onto the bus as soon as data is valid, i.e., data propagates from the input of the circuit to the bus without depending on a clock or other timing edge.

3 Claims, 3 Drawing Sheets

5,796,270

SELF-TIMED DRIVER CIRCUIT

This application is a division of application No. 08/506,933, filed Jul. 26, 1995 now U.S. Pat. No. 5,561,694.

BACKGROUND OF THE INVENTION

1. Technical Field

This invention generally relates to output circuits for integrated circuits, and more specifically relates to a driver circuit that is self-timed by the occurrence of data, thereby passing data to the output without requiring a clock edge.

2. Background Art

Many modern electronic circuits require output drivers to selectively output a data signal at a desired time. Many known output drivers include an output data latch driven by a data signal, and a three-state output buffer driven by an output enable signal. Data is typically stored on the output latch, and at some later time the output enable signal is asserted to cause the data stored on the output latch to be driven through the three-state buffer to the output of the driver circuit. In this manner, the latching of data in the output latch is relatively non-critical, i.e., it may occur much sooner than needed, since the data is not enabled onto the output until the output enable signal occurs. This type of output driver relieves strict timing constraints on the data signal, but imposes strict timing constraints on the output enable signal, since the output enable signal must occur at the precise time when data is required on the output.

Various related art data latch and driver circuits are known. Examples of these related art circuits are found in U.S. Pat. No. 4,849,658 "Dynamic Logic Circuit Including Bipolar Transistors and Field-Effect Transistors" (issued Jul. 18, 1989 to Iwamura et al. and assigned to Hitachi, Ltd.); U.S. Pat. No. 4,758,739 "Read Back Latch" (issued Jul. 19, 1988 to Ovens et al. and assigned to Texas Instruments, Inc.); and U.S. Pat. No. 4,334,157 "Data Latch with Enable Signal Gating" (issued Jun. 6, 1982 to Ferris and assigned to Fairchild Camera and Instrument Corp.). Each of these related art circuits require a clock edge or an output enable signal to output the stored data at the appropriate time. None of the known related art circuits provide for data to be self-timed, i.e., for data to be output without requiring an additional timing edge.

Many related art driver circuits thus have outputs gated by the output enable signal, placing the output enable signal in the critical access path for data. The occurrence of the output enable signal must have sufficient timing margins to assure proper assertion of data under all possible circuit conditions, including variations caused by changes in temperature, load, and power supply voltage. The result of these timing margins is that the output enable signal is typically delayed from the occurrence of data, which slows down system operation if data could otherwise be used earlier.

Output driver circuits are common in modern computer systems. Modern computer systems typically include one or more microprocessors and other circuitry which are coupled to one or more address and data busses. To improve the speed of operation of these systems, the dynamic bus was introduced. A dynamic bus is pre-charged to a certain logic level, then the signals on the bus that are not at that logic level are driven at the opposite logic level at the appropriate time of the bus cycle. For example, a dynamic bus may be pre-charged high at the beginning of the bus cycle, with the appropriate signals being pulled low by the output driver circuits at the appropriate time in the bus cycle. The dynamic bus architecture eliminated the need for the totem-pole output that was typically used to drive the output to either a high or a low state, depending on the state of the data stored on the output latch. With the dynamic bus, if the bus is pre-charged high, the output driver must only pull the bus line low if the data to be driven is low. If the data to be driven is high, the bus line is already pre-charged to the high state, and the output driver need do nothing. In like manner, if the bus is pre-charged low, the output driver need only pull the bus line high if the data to be driven is high.

The related art practice of putting the output enable signal in the critical access path for all bus cycles slows down the operation of the related art drivers when coupled to a dynamic bus. Therefore, there existed a need to provide a driver which is self-timed for most bus cycles, passing through data when data occurs without waiting for a subsequent timing edge, while also allowing for data to be gated by a later assertion of the output enable signal when necessary.

DISCLOSURE OF INVENTION

According to the present invention, a self-timed driver circuit includes a latch and various FET transistors and gates for selectively driving a bus line to a desired logic state. The latch is set to a known state at the beginning of the bus cycle, and the output of the latch blocks data from being output to the bus until the data is valid. At the beginning of the bus cycle, a data complement line is pre-charged to a predetermined logic state. When the data complement line is asserted (i.e., goes to the opposite state of the predetermined pre-charge state), indicating valid complement data, the latch changes state, enabling the data output to the bus if output enable is asserted. In this manner output enable may occur early, i.e., before data is valid, causing data to be self-timed, i.e., data propagates from input to output with only the delays of the circuit elements, without waiting for a subsequent timing edge. If output enable is asserted before data is valid, output enable is taken out of the critical access path for data. With the device of the present invention, the faster data propagation to the bus results in an improved speed of operation for the circuit, allowing enhanced system performance. At the same time, if the bus cannot be driven when data becomes valid due to a potential bus conflict, the output enable signal may be delayed until after data is valid. If output enable is delayed, the output of the driver circuit is gated by the output enable signal, similar to the related art driver circuits, placing output enable back in the critical access path for data.

The foregoing and other objects, features and advantages of the invention will be apparent from the following more particular description of preferred embodiments of the invention, as illustrated in the accompanying drawings.

BRIEF DESCRIPTION OF DRAWINGS

The preferred exemplary embodiments of the present invention will hereinafter be described in conjunction with the appended drawings, where like designations denote like elements, and.

BEST MODE FOR CARRYING OUT THE INVENTION

Figures 1, 2:
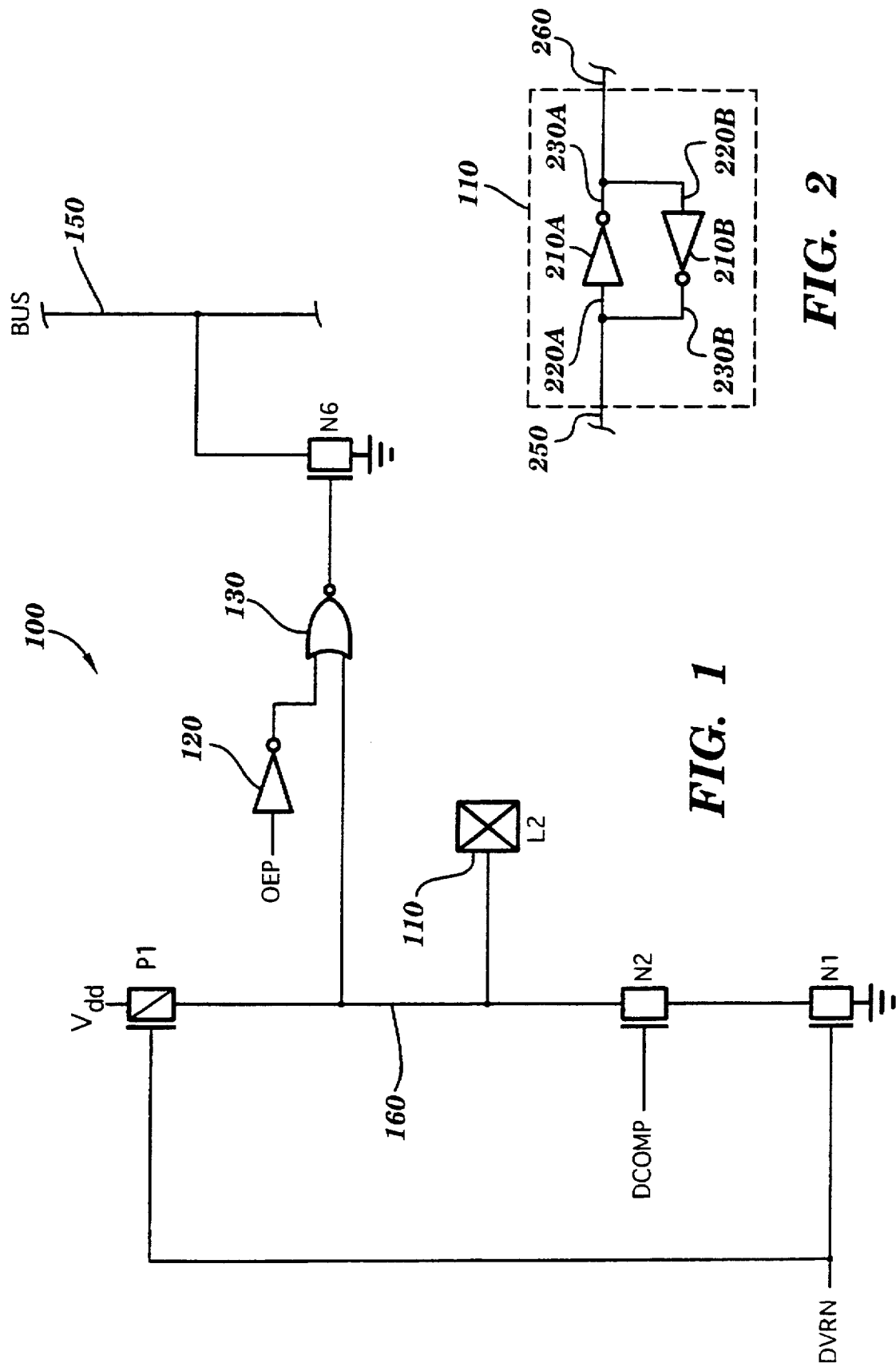
FIG. 1 is a schematic diagram of the self-timed driver circuit in accordance with a preferred embodiment of the present invention.
FIG. 2 is a schematic diagram of latches 110 shown in FIGS. 1 and 3.

Referring to FIG. 1, a self-timed driver circuit 100 in accordance with a preferred embodiment of the present invention includes a latch L2, NFETs N1, N2 and N6, PFET P1, inverter 120, and gate 130. Circuit 100 suitably comprises a driver circuit for one line 150 in a dynamic bus, which is pre-charged to a predetermined logic level at the beginning of each bus cycle. Dynamic bus line 150 is not driven by circuit 100 if the data corresponds to the pre-charged state, but is driven to the opposite logic level by circuit 100 if the data is opposite of the pre-charged state. For the specific circuit illustrated in FIG. 1, bus line 150 is pre-charged high, and circuit 100 drives bus line 150 low if the data to be driven is low. Circuit 100 is set to a known state at the beginning of each bus cycle which inhibits driving bus line 150 until data occurs. If data is high, circuit 100 does not drive bus line 150, leaving bus line 150 in its high pre-charged state. If data is low, circuit 100 drives bus line 150 once the data is valid and an output enable signal OEP is asserted (e.g., high). One significant benefit of circuit 100 is that the timing of the output enable signal OEP is non-critical in most cases. OEP may occur before data is valid, since the output of circuit 100 is self-timed with respect to the occurrence of data. While the output enable signal OEP is still required, the timing constraints on this signal are removed if OEP occurs prior to valid data, resulting in faster propagation of data to bus 150, thereby enhancing system performance. OEP is thus removed from the critical access path for data as long as OEP is asserted before data is valid. Note, however, that the output enable signal OEP may also be delayed if data cannot be driven on bus line 150 when data becomes valid, such as when another device is driving bus line 150. Delaying OEP until some time after data is valid results in data propagating to bus 150 in a manner similar to the related art, gated by OEP, once again placing OEP in the critical access path for data.

Latch L2 suitably comprises a latch which is set at the beginning of each bus cycle to a predetermined state that blocks the output of circuit 100 until DCOMP is asserted, indicating valid complementary data for that bus cycle. Once DCOMP is asserted, latch L2 changes state, allowing bus line 150 to be driven low if the output enable signal OEP has already been asserted. Referring to FIG. 2, latch L2 suitably comprises circuitry 110, which includes two back-to-back inverters 210A and 210B. The output 230A of inverter 210A is coupled to the input 220B of inverter 210B, while the output 230B of inverter 210B is coupled to the input 220A of inverter 210A.

Latch 110 may be "set" and "reset" to a desired state by coupling either line 250 or 260 to a high or low voltage source, sufficient to overpower the logic output of the inverter that is attempting to drive the line to the opposite state. For example, for the circuit of FIG. 2, if latch 110 is in a state where line 250 is low and line 260 is high, latch 110 may be set to the opposite state either by coupling a high logic level voltage to line 250, or by coupling a low logic level voltage to line 260. If a high logic level voltage is applied to line 250, inverter 210B, which is driving line 250, initially draws current as it attempts to drive line 250 low. The high logic level voltage applied to line 250 must have current sourcing capabilities that exceed the current sinking capabilities of inverter 210B, resulting in the high logic level voltage pulling line 250 to a high state. Placing line 250 in a high state while inverter 210B is driving its output 230B low results in a momentary current surge in inverter 210B, but this current surge is short-lived. The high logic level voltage on line 250 causes the output 230A of inverter 210A to go low, which in turn causes the input 220B of inverter 210B to go low. With input 220B low, inverter 210B drives its output 230B high, eliminating the current surge. Thus, the current surge for changing the state of latch 110 lasts only long enough for the two inverters 210A and 210B to change state. Note that, as stated above, latch 110 may also be changed to the opposite state by coupling line 260 low, resulting in a momentary current surge in inverter 210A until the signal propagates through inverters 210B and 210A.

Figure 6:
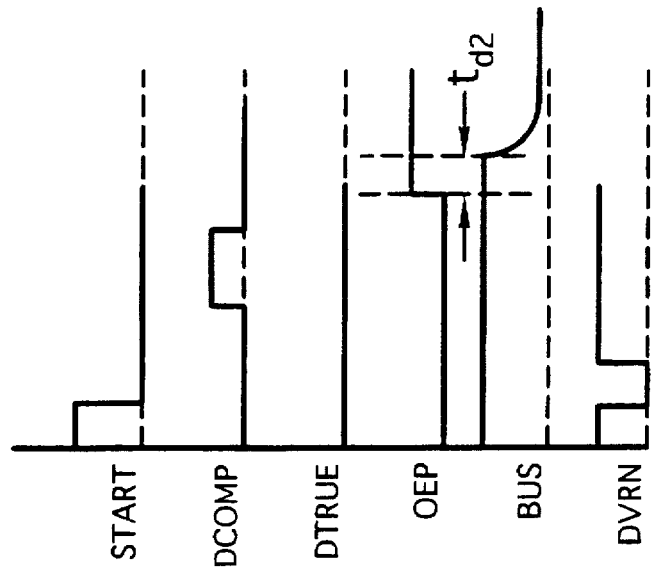
FIG. 6 is a timing diagram showing the operation of the circuit of FIGS. 1 and 3 when the output enable signal is asserted after data is valid.
Figure 5:
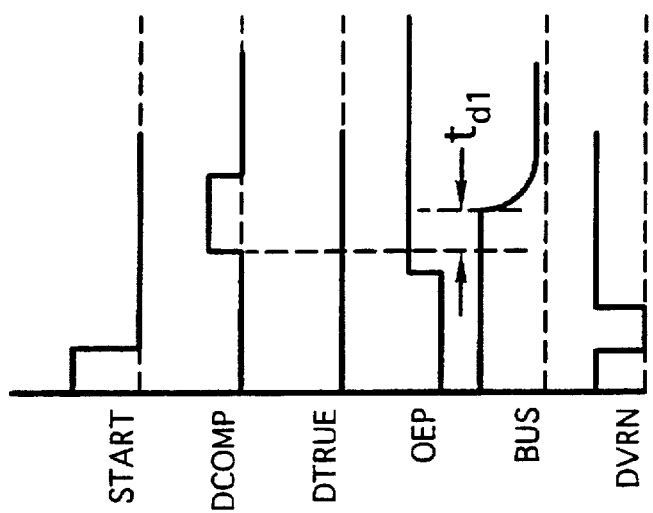
FIG. 5 is a timing diagram showing the operation of the circuit of FIGS. 1 and 3 when the output enable signal is asserted before data is valid.

The function of circuit 100 may best be understood with reference to the timing diagrams of FIGS. 5 and 6. At the beginning of a bus cycle, a signal START is driven low. In response to START going low, a Data Valid Reset Not (DVRN) signal goes low, then is driven back high. Data line DCOMP is initially pre-charged low at the beginning of the bus cycle, and goes high if the data intended for bus line 150 is low. When DVRN goes low, NFET N1 is turned off and PFET P1 is turned on, thereby coupling Vdd to node 160. This high logic voltage level on node 160 sets latch L2 to a high state, resulting in latch L2 driving node 160 high even when DVRN goes back high. With DVRN high, PFET P1 is turned off and NFET N1 is turned on. NFET N2 is off, since DCOMP is low, resulting in node 160 staying at a high logic level as driven by latch L2. With node 160 high, the output of NOR gate 130 is driven low, which turns off pull-down NFET N6. Thus, by setting latch L2 high when DVRN goes low, the output of circuit 100 is inhibited until complementary data actually occurs (i.e., DCOMP goes high), creating a driver circuit 100 that is self-timed with the occurrence of data (provided that OEP occurs before the occurrence of data, as in FIG. 5).

Figure 3:
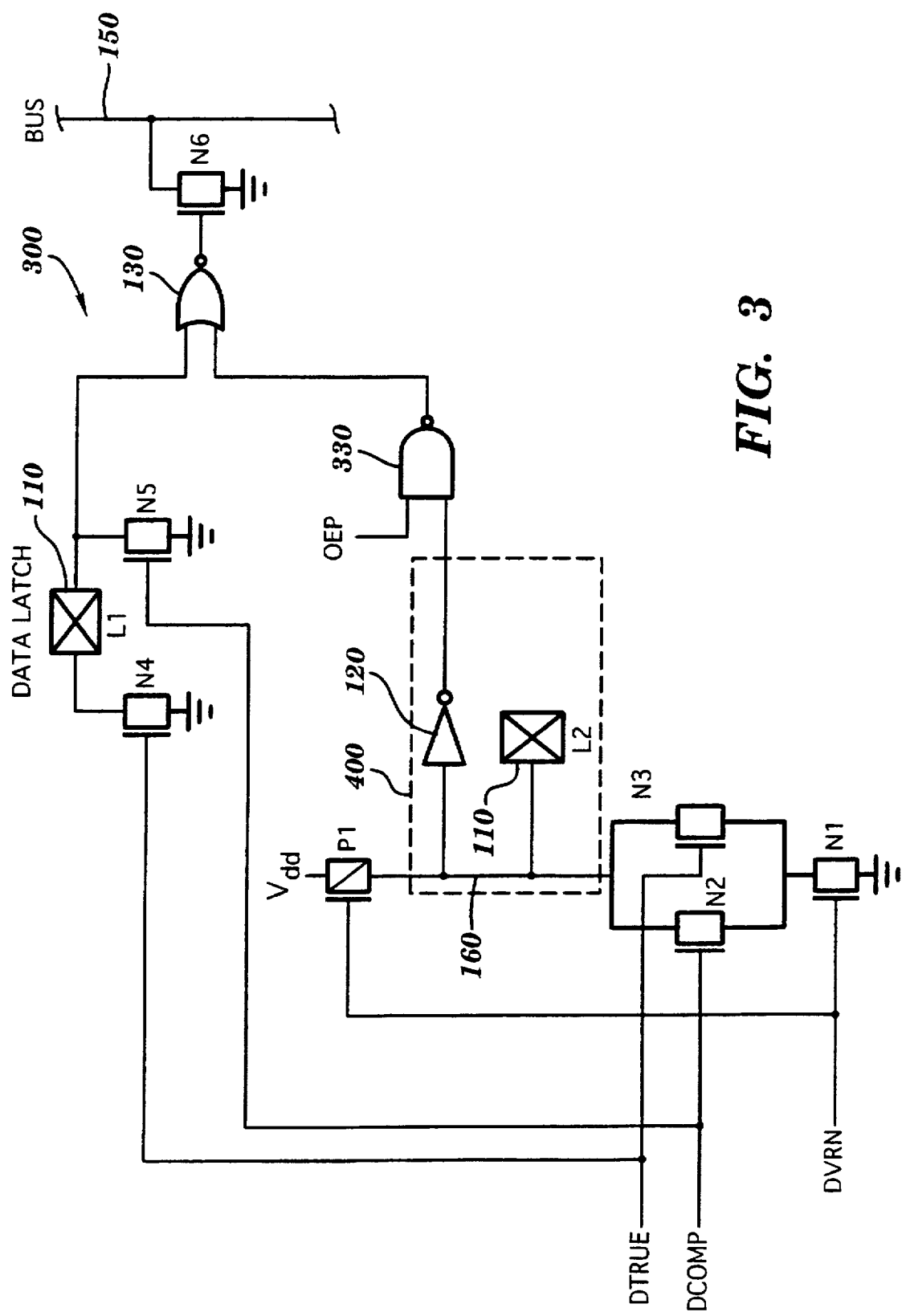
FIG. 3 is a schematic diagram of the self-timed driver circuit in accordance with an alternative embodiment of the present invention.

For the particular case shown in FIG. 5, sometime between the rising edge of DVRN and the rising edge of DCOMP, the output enable signal OEP is suitably asserted high, thereby enabling the output to bus 150 when data arrives (i.e., when DCOMP goes high). When OEP occurs before DCOMP, bus line 150 is driven low after the propagation delay time $t_{d1}$ for DCOMP to propagate through NFET N2, gate 130, and NFET N6. Referring now to FIG. 6, if data cannot be enabled on bus line 150 until after data is valid, OEP is delayed until after the rising edge of DCOMP. This results in a data output to bus line 150 that is gated by OEP, resulting in bus line 150 being driven low after the propagation delay time $t_{d2}$ of OEP through inverter 120, gate 130 and NFET N6. Referring to FIG. 3, a driver circuit 300 in accordance with an alternative embodiment of the present invention suitably comprises many of the same circuit elements as the first embodiment (FIG. 1), namely: NFETs N1, N2, and N6; PFET P1; latch L2; inverter 120; NOR gate 130; and additionally includes a data latch L1, additional NFETs N3–N5, and gate 330. Circuit 300 drives bus line 150 in the 20 same manner as circuit 100 of FIG. 1, as shown in FIGS. 5 and 6. However, the internal function of circuit 300 is different from circuit 100, as described below.

At the beginning of each bus cycle, DVRN sets latch L2 high by coupling Vdd to node 160. The high signal on node 160 causes inverter 120 to drive its output low, causing NAND gate 330 to drive its output high. A high signal on the output of NAND gate 330 causes NOR gate 130 to drive its output low, turning NFET N6 off, and keeping bus 150 in its pre-charged (e.g., high) state. In this manner latch L2 inhibits the data stored on data latch L1 from potentially affecting the output of NOR gate 130 until data is valid.

If the data desired on bus line 150 during a given bus cycle is high, DTRUE goes high, turning on N3 and N4. With DVRN still high, N1 is turned on, resulting in node 160 being discharged to ground through N1 and N3. A low on node 160 causes the output of inverter 120 to go high. Assuming that OEP went high sometime after the rising edge of DVRN and before the rising edge of DTRUE, the high output of inverter 120 drives the output of NAND gate 330 low. However, the rising edge of DTRUE also turns on N4, which sets the output of data latch L1 high. While DTRUE turns on both N3 and N4, the signal at N4 only passes through data latch L1 to reach NOR gate 130, while the signal at N3 must propagate through inverter 120 and NAND gate 330 before reaching NOR gate 130. Given this difference in propagation delay, when DTRUE goes high, the output of data latch L1 goes high before the output of gate 330 can go low, keeping the output of NOR gate 130 low, which keeps NFET N6 turned off. Thus, during a bus cycle where the data is high, NOR gate 130 keeps N6 from turning on, keeping bus line 150 in its high pre-charged state.

If the data desired on bus line 150 is low, FET N6 must be turned on to pull down bus line 150 to a low logic level, as shown in FIGS. 5 and 6. DVRN presets latch L2, resulting in node 160 being driven high by latch L2. If the data for the current bus cycle is low, DCOMP goes high when the data is valid. DCOMP going high causes N2 to turn on. N1 is still turned on with DVRN high. As a result, node 160 is discharged to ground through N2 and N1, changing the state of latch L2 to drive node 160 low. At the same time, N5 is turned on by DCOMP to set the output of data latch L1 low. With node 160 low, the output of inverter 120 goes high. Assuming that OEP went high sometime between the rising edge of DVRN and the rising edge of DCOMP (FIG. 5), the high output on inverter 120 causes the output of NAND gate 330 to go low. With both inputs of NOR gate 130 low, its output goes high, turning on NFET N6, which pulls bus line 150 low. Note that if OEP is delayed past the rising edge of DCOMP (FIG. 6), the output of gate 330 is then delayed until OEP occurs. Circuit 300 is thus self-timed for bus cycles where OEP occurs before data is valid, but still provides the required gating of the output with OEP if bus 150 cannot be driven until sometime after data is valid. Circuit 300 thus provides improved system performance by self-timing the driver output whenever possible.

Figure 4:
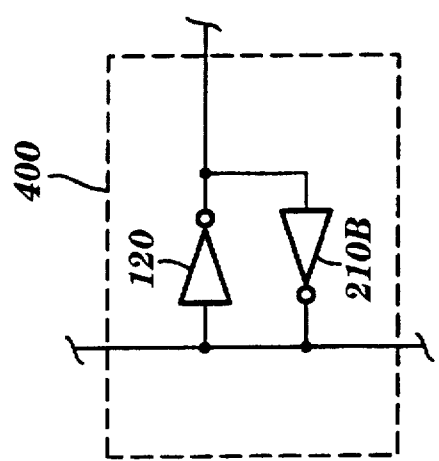
FIG. 4 is a schematic diagram of an alternative implementation of the circuit in box 400 of FIGS. 1 and 3.

Note that a portion 400 of circuit 300 of FIG. 3, comprising latch L2 and inverter 120, may be simplified somewhat, if desired. Since latch L2 suitably consists of two back-to-back inverters (as shown in FIG. 2), inverter 210A (see FIG. 2) may be replaced by inverter 120 to achieve the same function, as shown in FIG. 4. While the implementation of FIG. 4 saves one inverter, it also requires that inverter 120 drive inverter 210B and an additional gate 330, which requires that inverter 120 have different design parameters than if inverter 120 drives only inverter 210B. As a result, the preferred and alternative embodiments described herein use the circuit as shown in FIG. 3, with a further alternative embodiment comprising replacing circuit 400 of FIG. 3 with circuit 400 of FIG. 4.

While the invention has been particularly shown and described with reference to a preferred exemplary embodiment thereof, it will be understood by those skilled in the art that various changes in form and details may be made therein without departing from the spirit and scope of the invention. For example, while the example of circuit 100 illustrated in the figures shows a dynamic bus line 150 that is pre-charged high and driven low by circuit 100, the circuit in accordance with the present invention could also be configured for a bus line that is pre-charged low and driven high by circuit 100, e.g., by substituting a PFET for NFET N6 and by substituting an OR gate for NOR gate 130 in circuit 100. Furthermore, data lines DCOMP and DTRUE could be pre-charged high and be valid when low, which would require, e.g., for circuit 300, that PFETs be substituted for NFETs N2 and N3 and that circuit 300 be appropriately designed to provide equivalent operation. In addition, it will be understood that, while various of the conductors or connections are shown in the drawing as single lines, they are not so shown in a limiting sense, and may comprise plural conductors or connections, as is understood in the art.

We claim:

1. A driver circuit with a self-timed output, comprising:

input means coupled to at least one data input, the data input driving the input means to one of two complementary logic states, the first of the two complementary logic states corresponding to valid data and the second of the two complementary logic states corresponding to invalid data;

output means for selectively driving the output;

data reset means for placing the output means in a first output state that does not drive the output in response to the data reset means receiving a data reset pulse; and control means coupled to the input means, the output means, and the data reset means, for causing the output means to change from the first output state to a second output state that drives the output at a time determined by the data input driving the input means to the first of the two complementary logic states.

2. The driver circuit of claim 1 wherein the control means functions independently of a clock signal.

3. A method for selectively driving an output signal, comprising the steps of:

providing input means coupled to at least one data input, the data input driving the input means to one of two complementary logic states, the first of the two complementary logic states corresponding to valid data and the second of the two complementary logic states corresponding to invalid data;

providing output means for selectively driving the output signal;

providing data reset means for placing the output means in a first output state that does not drive the output in response to the data reset means receiving a data reset pulse;

providing control means coupled to the input means, the output means, and the data reset means, for causing the output means to change from the first state to a second state that drives the output at a time determined by the data input driving the input means to the first of the two complementary logic states;

pulsing the data reset pulse to place the output means in the first output state;

the output means changing from the first output state to the second output state when the input means is first driven to the first of the two logic states after the data reset pulse occurs.

* * * * *